United States Patent
O'Keeffe et al.

(10) Patent No.: US 6,509,752 B1
(45) Date of Patent: Jan. 21, 2003

(54) TESTING APPARATUS WITH MECHANISM FOR PREVENTING DAMAGE TO UNIT UNDER TEST

(75) Inventors: Paul O'Keeffe, Cork (IR); Robert Khoshabjian, West Roxbury, MA (US)

(73) Assignee: EMC Corporation, Hopkinton, MA (US)

(*) Notice: Subject to any disclaimer, the term of this patent is extended or adjusted under 35 U.S.C. 154(b) by 0 days.

(21) Appl. No.: 09/800,392

(22) Filed: Mar. 5, 2001

(51) Int. Cl.[7] .............................................. G01R 31/02
(52) U.S. Cl. ...................... 324/754; 324/755; 324/765
(58) Field of Search ................................ 324/755, 754, 324/761, 765; 439/66, 71.45

(56) References Cited

U.S. PATENT DOCUMENTS

| | | | |
|---|---|---|---|
| 4,721,908 A | | 1/1988 | Driller et al. |
| 5,493,230 A | | 2/1996 | Swart et al. |
| 5,688,127 A | | 11/1997 | Stabb et al. |
| 5,859,538 A | | 1/1999 | Self |
| 5,892,245 A | * | 4/1999 | Hilton ........................ 257/48 |
| 6,066,957 A | | 5/2000 | Van Loan et al. |
| 6,084,397 A | | 7/2000 | Downes |
| 6,084,421 A | * | 7/2000 | Swart et al. ................. 324/754 |
| 6,127,833 A | * | 10/2000 | Wu et al. .................... 324/754 |
| 6,179,631 B1 | | 1/2001 | Downes et al. |
| 6,208,155 B1 | * | 3/2001 | Barabi et al. ............... 324/754 |

OTHER PUBLICATIONS

Exhibit A—*Vise–Grip* and *Logic Analyzer Adaptor for HP Logic Analyzer*, Advanced Interconnections, West Warwick, RI, May 6, 1999 (6 pages).
Exhibit B—*Logic Analyzer Adaptor for HP Logic Analyzer*, subtitled *"Shown with Mounting Hardware"*, Advanced Interconnections, West Warwick, RI, May 6, 1999 (5 pages).
Exhibit C—Cross–sectional side view of device with instructions "Turn Collet Screw Clockwise to Draw the Lower Collet Plate . . . ", Mar. 2000 (1 page).

* cited by examiner

Primary Examiner—Michael Sherry
Assistant Examiner—Tung X. Nguyen
(74) Attorney, Agent, or Firm—Chapin & Huang, L.L.C.; David E. Huang, Esq.

(57) ABSTRACT

In one embodiment of the present invention, an apparatus is provided for use in testing a unit under test (UUT). The apparatus includes first and second assemblies. The first assembly has a plurality of members that extend from a surface of the first assembly and an electrically conductive test probe that extends from the surface. The second assembly includes openings dimensioned to receive respective ones of the members, and mechanisms that engage and apply a force to the members when the members are in the openings. When the UUT is under test, the members extend through openings in a PCB that are disposed around a ball grid array (BGA) device, and the force causes the assemblies to be urged toward each other so as to bring the probe into contact with a PCB via that is electrically connected to the BGA.

12 Claims, 5 Drawing Sheets

TESTING APPARATUS WITH MECHANISM FOR PREVENTING DAMAGE TO UNIT UNDER TEST

BACKGROUND OF THE INVENTION

1. Field of the Invention

The present invention relates generally to an electronic testing apparatus, and more specifically, to such an apparatus wherein one or more test probes are used to facilitate testing of a unit under test (UUT) that includes a ball grid array (BGA) device.

2. Brief Description of Related Prior Art

Many conventional automated systems/procedures currently exist for stimulus/response testing of various UUTs. In general, automated testing involves supplying test input stimuli (e.g., commands, data, etc.) to the UUT, observing actual outputs (e.g., actions, data, etc.) generated by the UUT in response to the stimuli, and comparing the actual outputs to outputs that are expected if the UUT is functioning properly. Depending upon the degree to which the actual outputs match those that are expected, the testing system will indicate either that the UUT has passed the test (i.e., is functioning properly), or has failed the test (i.e., is not functioning properly).

The printed circuit board (PCB) is one type of UUT for which many conventional automated systems/procedures/schema have been developed. A PCB may contain many different types of electrical components, at least some of which components may be surfaced mounted to the PCB. One of the more recently developed types of electrical components that may be surface mounted to a PCB is the BGA device.

The on-going trend in the industry toward miniaturization of electronic components has led increasingly to PCB surfaces becoming crowded with many closely-spaced electronic components. This has made testing of PCBs difficult, since it may be difficult to make electrical connections between the individual electronic components of the PCB UUT and the test analyzer circuitry necessary to perform the testing of the PCB, without either damaging and/or shorting together the electronic components. This problem has been particularly exacerbated by the fact that mounted BGA devices do not have the conventional leads that other types of PCB electronic components may have.

One conventional technique for testing a BGA device mounted to a PCB may involve manually contacting the individual BGA vias themselves, or connectors soldered thereto, with electrical test input and output probes so as to permit electrical test input and output vectors to be applied to and received from, respectively, the BGA device, without either damaging the BGA device or other electronic components of the PCB, or shorting such components together. As can be readily appreciated, in practice, this conventional technique may be slow and tedious to carry out, and may involve a substantial risk of introducing human error into the testing process. Additionally, the soldering of connectors to the BGA vias may render the PCB unsuitable, from a practical standpoint, for further use, after testing has been completed.

SUMMARY OF THE INVENTION

Accordingly, in broad concept, an apparatus is provided according to the present invention that overcomes the aforesaid and other disadvantages and drawbacks of the prior art.

In one embodiment of the present invention, an apparatus is provided for use in testing a UUT. The UUT includes a BGA device that is physically connected to a first surface of a first PCB. The PCB also includes one or more vias on a second surface of the PCB. The first and second surfaces of the PCB face mutually opposite directions. The one or more vias are electrically connected to one or more electrically active points of the BGA device.

The apparatus of this embodiment includes first and second assemblies. The first assembly includes a multiplicity of members that extend from a surface of the first assembly. The first assembly also includes one or more electrically conductive test probes that extend from the surface of the first assembly. The second assembly includes openings that are dimensioned to receive respective members, and first and second mechanisms. When the members are in the openings, the first mechanism may engage the members. When the members are engaged by the first mechanism, the second mechanism may apply a force to the members that may cause the first assembly to be urged toward the second assembly. When the apparatus is in use testing the UUT, the members may extend through respective openings around the BGA device and the force applied by the second mechanism may permit the one or more test probes to be brought into physical and electrical contact with the one or more PCB vias. The respective openings in the PCB may be in a region of the PCB that extends around the periphery of the BGA device. The region may be devoid of active electronic components of the UUT.

In this embodiment, the apparatus may also include one or more stops that extend from the surface of the first assembly. The stops may be dimensioned to provide a gap between the second surface of the PCB and the surface of the first assembly when the apparatus is in use. The gap may be dimensioned to prevent the apparatus from damaging the UUT, but to allow the one or more test probes to contact the one or more vias when the apparatus is in use.

Alternatively, the members may each comprise two respective portions. One of these respective portions may be undersized relative to the respective openings in the PCB, and the other of these respective portions may be oversized relative to the respective openings in the PCB. When the apparatus is in use testing the UUT, the other of the respective portions may extend from the surface of the first assembly to the second surface of the PCB and may provide a gap between the second surface of the PCB and the surface of the first assembly that prevents the apparatus from damaging the UUT, but allows the one or more test probes to contact the one or more vias.

The one or more vias may comprise a plurality of vias. The one or more probes may comprise a plurality of probes, and the plurality of probes may contact respective vias. The apparatus may be dimensioned to contact the PCB, when the apparatus is in use testing the UUT, only at the respective vias and within regions of the PCB that are devoid of active electronic components.

The one or more test probes may be spring-loaded "pogo" pins. Also, the first assembly may comprise a second PCB and the surface of the first assembly may be a surface of the second PCB. The second PBC may include an electromechanical connection mechanism that may be used to electrically couple the one or more test probes to an electronic test analysis system.

By using the present invention, electrical test connections may be made between test circuitry and a BGA device mounted to a PCB UUT without having to manually contact the individual BGA vias or connectors soldered thereto, and without damaging the BGA device or other electronic components of the PCB, or shorting such components together. Thus, advantageously, by using the present invention, such electrical test connections may be made more easily, faster, and with less risk of introducing human error into the testing process, than may be possible according to the prior art.

These and other features and advantages of the present invention will become apparent as the following Detailed Description proceeds and upon reference to the Figures of the Drawings, in which like numerals depict like parts, and wherein:

Figure 1:
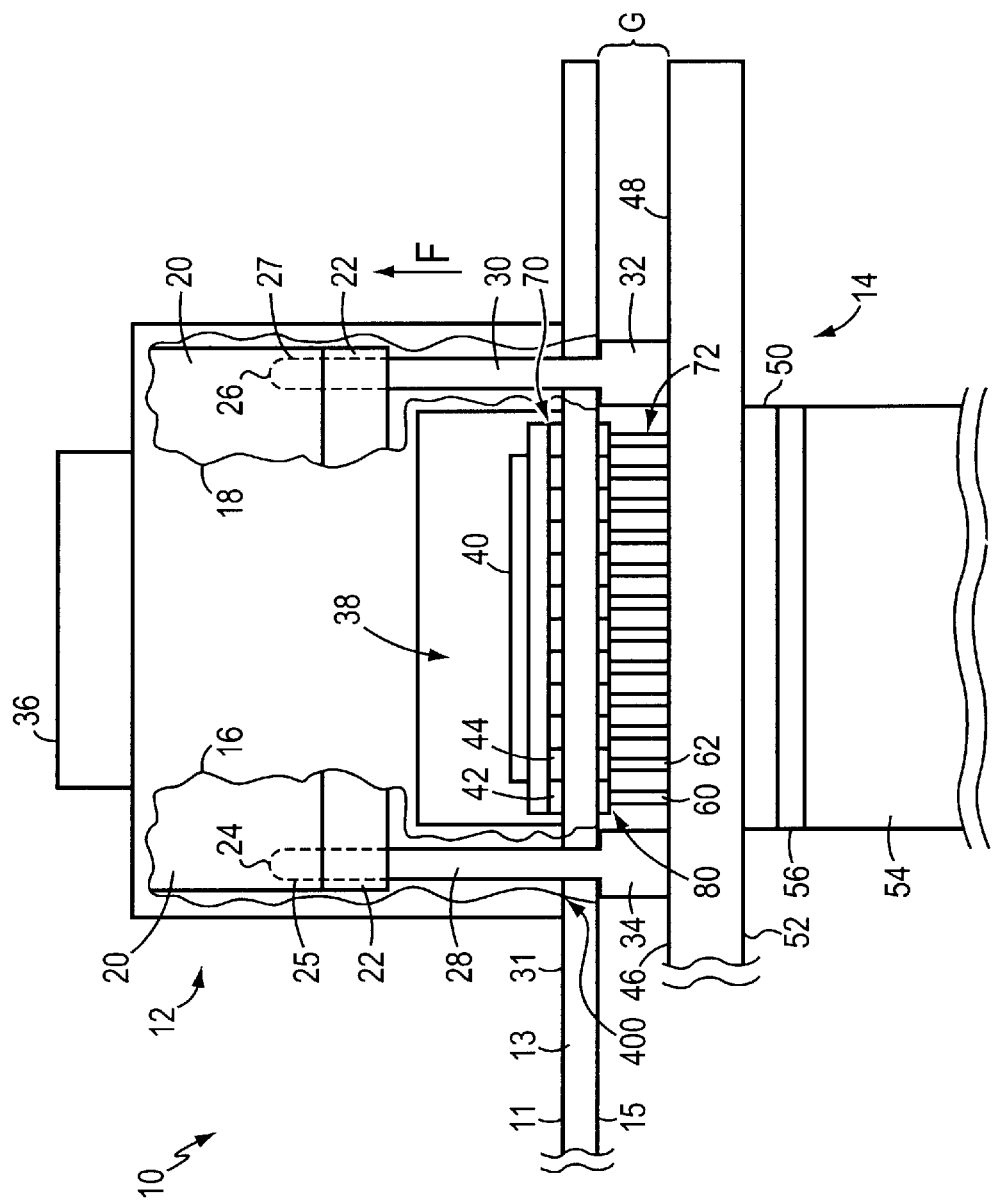
FIG. 1 is a highly schematic diagram illustrating components of one embodiment of the present invention in use testing a UUT.
Figure 2:
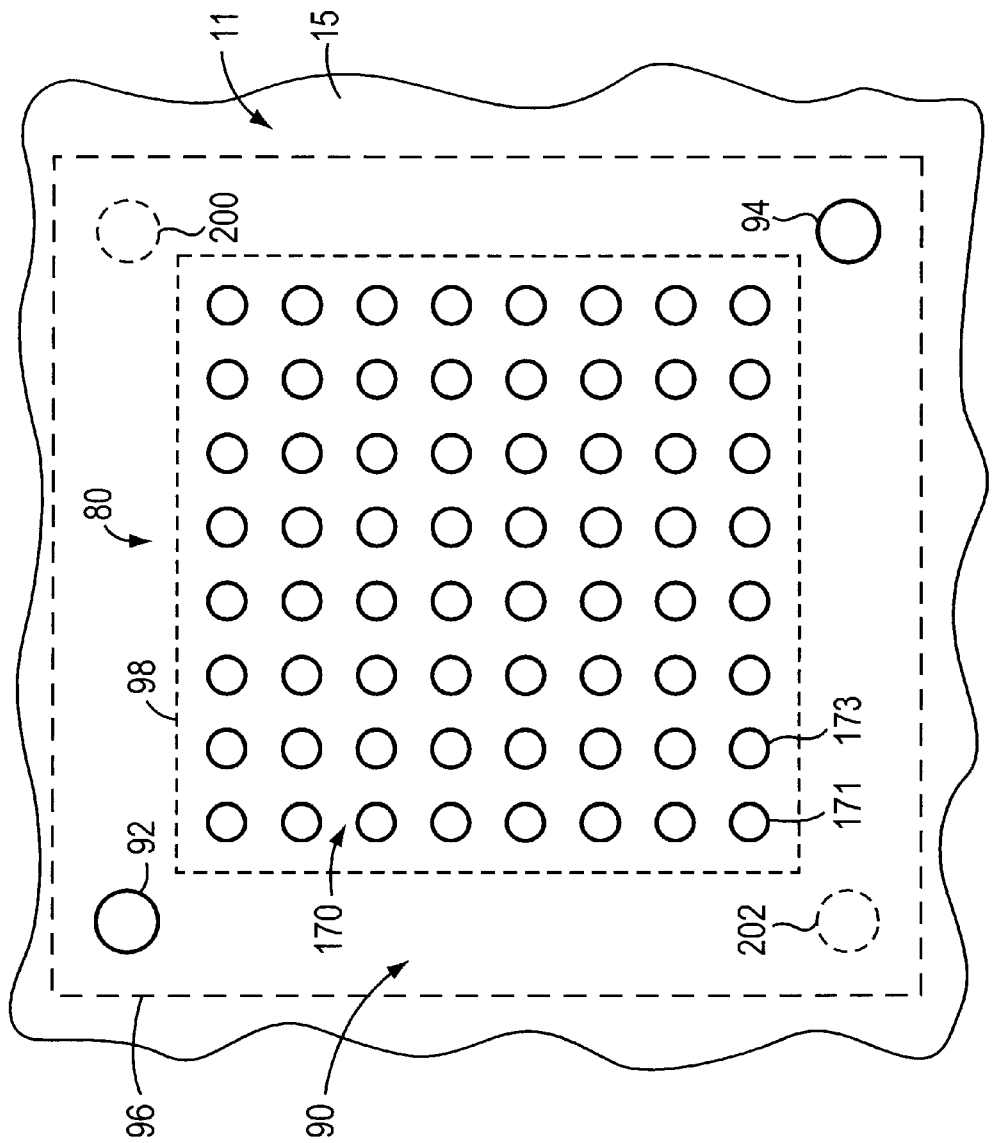
FIG. 2 is a partially schematic, plan view of a portion of a surface of the UUT illustrated in FIG. 1.
Figure 3:
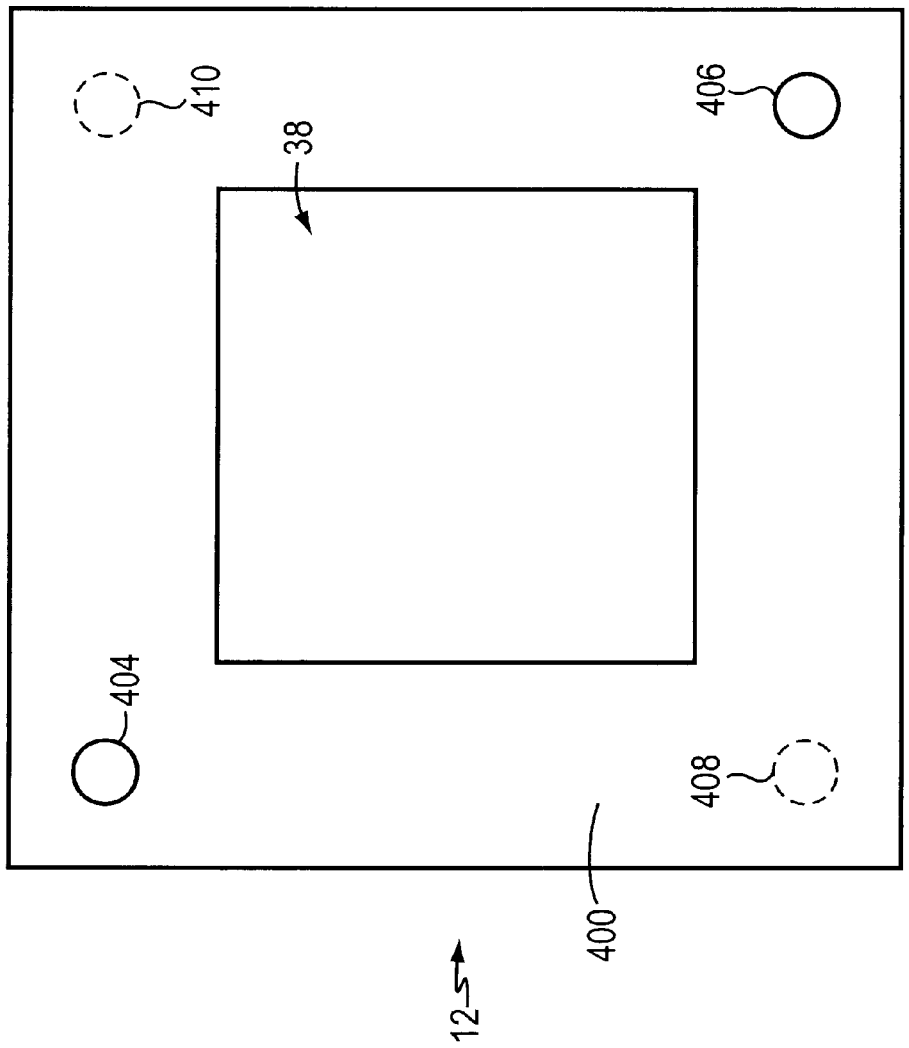
FIG. 3 is a partially schematic, plan view of a portion of one of the two assemblies in the embodiment illustrated in FIG. 1, for the purpose of illustrating the operation of the embodiment shown in FIG. 1.
Figure 4:
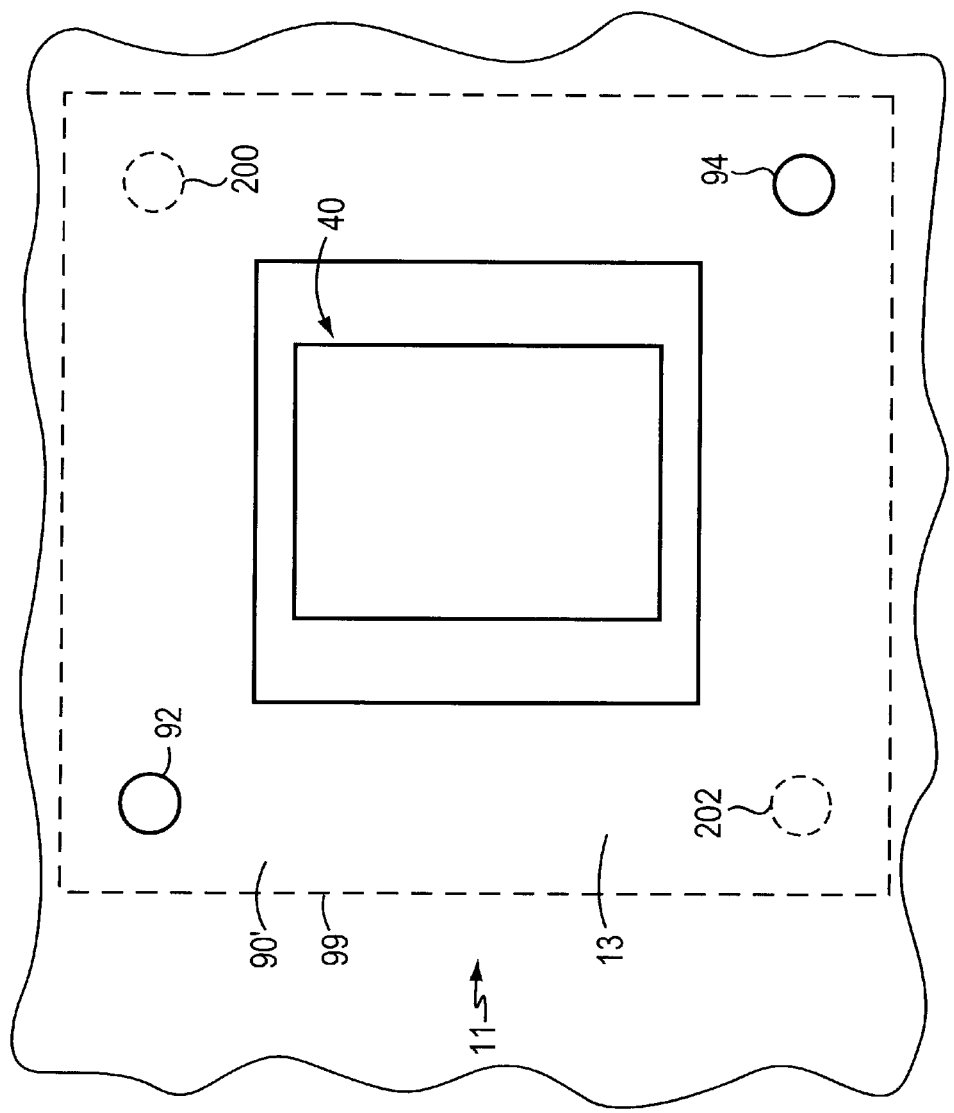
FIG. 4 is a partially schematic, plan view of a portion of another surface of the UUT illustrated in FIG. 1.

Although the following Detailed Description will proceed with reference being made to illustrative embodiments and methods of use of the present invention, it should be understood that it is not intended that the present invention be limited to these illustrative embodiments and methods of use. On contrary, many alternatives, modifications, and equivalents of these illustrative embodiments and methods of use will be apparent to those skilled in the art. Accordingly, the present invention should be viewed broadly as encompassing all such alternatives, modifications, and equivalents as will be apparent to those skilled in art, and should be viewed as being defined only as forth in the hereinafter appended claims.

DETAILED DESCRIPTION OF ILLUSTRATIVE EMBODIMENTS

With reference now being made to FIGS. 1–4, one embodiment 10 of the present invention will be described. As will be described more fully below, apparatus 10 is used to conduct stimulus/response testing of a UUT 31. Apparatus 10 includes two mating assemblies 12, 14. One 14 of the assemblies 12, 14 includes a PCB assembly 46 having two mutually oppositely facing surfaces 48, 52. A plurality of generally cylindrical structural members 25, 27 are mounted to the PCB assembly 46 and extend outwardly from one 48 of the surfaces 48, 52 at respective angles that are perpendicular to the surface 48. One or more generally cylindrical, electrically conductive, spring-loaded "pogo" test probe pins (collectively referred to by numeral 72) also extend outwardly from the surface 48 at respective angles that are perpendicular to the surface 48. Although not shown in the Figures, the probes 72 may be mounted or connected to the PCB 46 using a conventional mounting system that mechanically mounts the probes 72 to the PCB 46 while also permitting the probes 72 to be electrically coupled (e.g., via not shown circuit traces) to a conventional electromechanical coupling connector 50. The connector 50 may be mounted to or in the surface 52, and may be adapted to electrically and mechanically mate with another conventional electromechanical coupling connector 56 so as to electrically and mechanically couple the probes 72 to an electronic test analyzer system/circuit 54.

UUT 31 includes a PCB 11 having two mutually oppositely facing surfaces 13, 15. BGA device 40 is electrically and mechanically coupled to one 13 of the surfaces 13, 15 of the PCB 11. More specifically, one or more electrically active areas (collectively referred to by numeral 70) may be solder-connected to electrically conductive vias (collectively referred to by numeral 80) that extend through the PCB 11, from the surface 13 to which the BGA device 40 is mounted, to the opposite surface 15 of the PCB 11. Electrically active areas 70 may be, comprise, or include electrical connections to, electrical circuits comprised in the BGA device 40 that may be tested by the apparatus 10.

Each of the members 25, 27 may include two respective relatively differently sized portions. For example, member 25 may include a first portion 28 that is dimensioned (i.e., in terms of radius and circumference) relatively smaller than a second portion 34 of member 25. Similarly, the member 27 may include a first portion 30 that is dimensioned (i.e., in terms of radius and circumference) relatively smaller than a second portion 32 of member 27. The first portions 28, 30 of the members 25, 27, respectively, may be so dimensioned as to be undersized relative to respective through-holes 92, 94 in the PCB 11, and the second portions 34, 32 of the members 25, 27, respectively, may be so dimensioned as to be oversized relative to the respective through-holes 92, 94.

When the apparatus 10 is in use testing the UUT 31, the members 25, 27 may extend through openings 92, 94, respectively, in the PCB 11 of the UUT 31. When the members 25, 27 extend through the openings 92, 94, the portions 34, 32 of the members 92, 94, respectively, contact the surface 15 of the PCB 11 in a region 90 of the PCB 11. Region 90 extends from the periphery (denoted by dashed lines 98) of the region 170 of the surface 15 that includes the vias 80 to an arbitrary boundary (denoted by dashed lines 96). The region 90 of the surface 15 does not contain any active electrical components of the UUT 31 that may be physically contacted and damaged by parts of the assembly 14 when the apparatus 10 is in use testing the UUT 31. The members 25, 27 and region 90 are positioned and dimensioned so as to ensure that, when the apparatus 10 is in use testing the UUT 31, the portions 34, 32 of the members 25, 27 do not contact any portion of the UUT 31 outside of the region 90.

Apparatus 10 also includes another assembly 12. Assembly 12 includes a surface 400 having openings 404, 406 that are positioned in the assembly 12 and dimensioned so as to be able to receive portions 28, 30 of the members 25, 27, when the apparatus 10 is in use testing the UUT 31. Also when the apparatus 10 is in use testing the UUT 31, the surface 400 may contact a region 90' on the surface 13 of the PCB 11. Region 90' extends outwardly, on the surface 13 of the PCB 11, from the periphery of the BGA device 40 to a boundary (denoted by dashed lines 99) that is selected so as to coincide with the outermost extent of the surface 400 of the assembly 12. The assembly 12 may also include a cavity 38 that is dimensioned to receive and contain the BGA device 40 when the apparatus 10 is in use testing the UUT 31. The region 90' does not contain any active electrical components of the UUT 31 that may be physically contacted and damaged by the assembly 12 when the apparatus 10 is in use testing the UUT 31. The surface 400 and region 90' are positioned and dimensioned so as to ensure that, when the apparatus 10 is in use testing the UUT 31, the surface 400 does not contact the BGA device 40 or any portion of the UUT 31 outside of the region 90'. Heat-sink openings (not shown) may be located in assembly 12 so as to permit air heated in the cavity 38 by the BGA device 40, when the device 40 is operating, to be vented to, and replenished with cool air from, the ambient environment outside of the assembly 12.

Alternatively, the assembly 12 may comprise a heat sink riser/enclosure (not shown) that surrounds the BGA device 40 and contacts the region 90' when the apparatus 10 is in use testing the UUT 31. In this alternative, the surface 400 may be recessed relative to the portion of the heat sink riser/enclosure that contacts the region 90', and the heat sink riser/enclosure may contain openings that permit air heated in the cavity 38 by the BGA device 40, when the device 40 is operating, to be vented to, and replenished with cool air from, the ambient environment outside of the assembly 12.

Two conventional mechanisms (shown in block form in cut-away portions 16, 18 and denoted by numerals 20, 22 in FIG. 1) are also provided in assembly 12. The mechanisms 20, 22 are constructed to receive respective portions 24, 26 of the members 25, 27 when the members 25, 27 are placed into the openings 92, 94. One or more conventional actuating mechanisms (shown in block form and denoted by numeral 36 in FIG. 1) are included in assembly 12. The one or more mechanisms 36 may be used (e.g., by a not shown human operator of the apparatus 10), after the mechanisms 20, 22 have received the respective portions 24, 26 of the members 25, 27, to actuate one 22 of the mechanisms 20, 22 to engage and lock the received members 25, 27 inside the assembly 12 in such a way as to prevent the members 25, 27 from sliding out the assembly 12. After the mechanism 22 has been actuated to lock the members 25, 27 into the assembly 12, the mechanism 20 may be actuated by the one or more mechanisms 36 to controllably apply a force (denoted by the letter F in FIG. 1) to the members 25, 27. The mechanism 20 may apply the force F based upon well-known pneumatic, torsional, etc. principles. The force F applied to the members 25, 27 by the mechanism 20 acts along the respective longitudinal axes of the members 25, 27 and tends to urge or pull the PCB 46 toward the surface 400 of the assembly 12.

When the apparatus 10 is in use testing the UUT 31, the mechanism 20 may be controlled via the mechanisms 36 so as to cause the force F that is applied to the members 25, 27 to be such that the region 90' may be brought into physical contact with the surface 400, and the portions 34, 32 of the members 25, 27 may be brought into physical contact with the region 90, without causing the UUT 31 or any circuitry therein to be damaged by such contact. The test probes 72 are dimensioned and positioned such that when the mechanism 20 is so controlled, the respective probes 72 are brought into contact with respective vias 80, with no respective test probe contacting more than one of the respective vias 80; the probes 72 are spring-loaded so as urge the respective probes 72 into good physical and electrical contact with the respective vias 80.

When the probes 72 are in good contact with the vias 80, the test analyzer circuit 54 may supply test input stimuli (e.g., commands, data, etc.) to one or more of the probes (e.g., probe 60) via the couplings 50, 56 and the not shown circuit traces in PCB 11. The stimuli supplied to the one or more probes 60 are thence provided to one or more respective vias (e.g., via 171), and to the one or more respective active areas (e.g., active area 42) that are electrically connected to these one ore more respective vias. This excites the circuit components of the BGA device 40 and the UUT 31 to generate output signals. These output signals may be transmitted from one or more other active areas (e.g., active area 44) of the device 40 to one or more respective probes (e.g., probe 62) through one or more respective vias (e.g., via 173). Thence, the output signals may be provided to the test analyzer circuit 54 via the not shown circuit traces in PCB 11 and couplings 50, 56. The test analyzer circuit 54 may compare these outputs to predetermined outputs that are expected if the UUT 31 is functioning properly. Depending upon the degree to which the actual outputs from BGA device 40 match those that are expected, the testing system 54 may indicate either that the UUT 31 has passed the test (i.e., is functioning properly), or has failed the test (i.e., is not functioning properly).

Alternatively, the test analyzer circuit 54 may be configured not to supply test input stimuli to any of the probes 72. In this alternative arrangement, the analyzer circuit 54 may monitor and/or store outputs received from one or more of the probes 72 when the UUT 31 operates without receiving any stimuli from the analysis circuit 54. Thus, for purposes of the present invention, it should be understood that the term "test" may mean simply monitoring the operation of the UUT 31 without supplying test input stimuli to the UUT 31. However, it should also be understood that the meaning of the term "test" need not be limited to this definition, and depending upon the application to which the present invention is put, may also include supplying test input stimuli to the UUT 31.

In assembly 14, the respective longitudinal lengths of the first portions 34, 32 of the members 25, 27 may be selected so as to ensure that, when the apparatus 10 is in use testing the UUT 31, a gap or displacement (denoted by the letter G) may exist between the surface 48 and the surface 15. The magnitude of displacement G, and the dimensions and the spring constants of the spring-loading mechanisms in the probes 72 are chosen so as to ensure that the probes 72 do not damage the UUT 31 when the probes 72 are brought into physical contact with the vias 80 when the apparatus 10 is in use testing the UUT 31.

Figure 5:
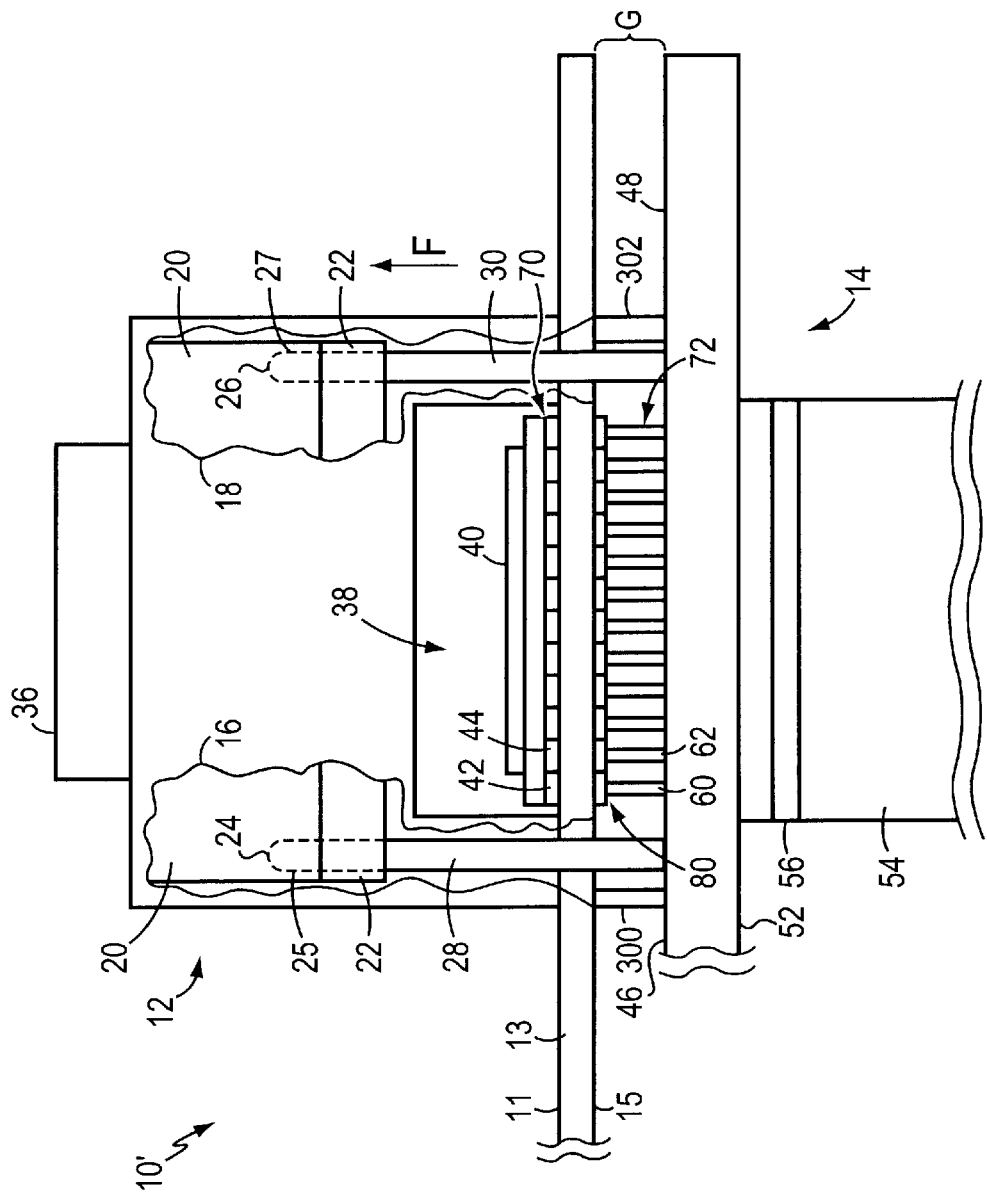
FIG. 5 is a highly schematic diagram illustrating components of a variation of the assembly of FIG. 1.

Turning now to FIG. 5, a variation 10' of the embodiment 10 shown in FIGS. 1–4 will be described. Apparatus 10' and apparatus 10 are substantially identical in construction and operation, except that in apparatus 10', the members 25, 27 are of substantially uniform radius and circumference, and a plurality of stops 300, 302 are mounted to the surface 48. The stops 300, 302 are positioned, dimensioned and constructed so as to physically contact the region 90 and support the UUT 31 during the testing of the UUT 31 by apparatus 10' such that constant displacement G is provided between surfaces 15 and 48.

Thus, it is evident that there has been provided, in accordance with the present invention, a testing apparatus that fully satisfies the aims and objectives, and achieve the advantages, hereinbefore set forth. The terms and expressions which have been employed in this application are used as terms of description and not of limitation, and there is no intention, in the use of such terms and expressions, of excluding any equivalents of the features shown and described or portions thereof, but it is recognized that various modifications are possible within the scope of the invention as claimed.

For example, if appropriately modified, instead of comprising only two support members 25, 27, the assembly 14 may include four such support members; these four support members may be dimensioned to pass through respective through-holes 92, 94, 200, 202 (with holes 200, 202 being shown in ghost in FIG. 2) in PCB 11 and to be received by respective openings 404, 406, 408, 410 (with openings 408, 410 being shown in ghost in FIG. 3) in assembly 12. After being received by the openings 404, 406, 408, 410, the four support members of this alternative arrangement may be locked in the assembly 12 by mechanism 22, and force F may be applied to the members by mechanism 20, substantially in manner described previously as being used to so lock and apply the force F to members 25, 27. Testing of the UUT 31 may then proceed in a manner that is substantially similar to that employed by apparatus 10, 10'.

Other modifications are also possible. Accordingly, the present invention should be viewed broadly as encompassing all modifications, variations, alternatives and equivalents as may be encompassed by the hereinafter appended claims.

What is claimed is:

1. Apparatus for use in testing a unit under test (UUT), the UUT including a ball grid array (BGA) device physically connected to a first surface of a first circuit board, the circuit board also including at least one via on a second surface of the circuit board, the first and second surfaces facing mutually opposite directions, the via being electrically connected to at least one electrically active point of the BGA device, the apparatus comprising:

a first assembly including a plurality of members extending from a surface of the assembly, the assembly also including at least one electrically conductive test probe extending from the surface of the assembly;

a second assembly that includes openings dimensioned to receive respective ones of the members, the second assembly including a first mechanism that permits, when the members are in the openings, the members to be engaged by the first mechanism, the second assembly also including a second mechanism that permits, when the members are engaged by the first mechanism, a force to be applied to the members that causes one of the first and second assemblies to be urged toward the other of the first and second assemblies; and a plurality of stops extending from the surface of the first assembly, the stops being dimensioned to provide a gap between the second surface of the circuit board and the surface of the first assembly when the apparatus is in use, the gap being dimensioned so as to prevent the apparatus from damaging the UUT and to allow the at least one test probe to contact the at least one via when the apparatus is in use;

wherein, when the apparatus is in use in testing the UUT, the members extend through respective openings in the circuit board, and the force permits the at least one test probe to be brought into physical contact with the via of the circuit board.

2. Apparatus according to claim 1, wherein the at least one test probe is spring-loaded.

3. Apparatus according to claim 1, wherein the first assembly comprises a second circuit board, the surface of the first assembly being a surface of the second circuit board.

4. Apparatus according to claim 3, wherein the second circuit board comprises an electromechanical connection mechanism that may be used to electrically couple the at least one test probe to an electronic analysis system.

5. Apparatus according to claim 1, wherein the respective openings are in a region of the circuit board extending around a periphery of the BGA device, said region being devoid of active electronic components of the UUT.

6. Apparatus according to claim 1, wherein the at least one via comprises a plurality of vias, the at least one probe comprises a plurality of probes, the plurality of probes contact respective vias, and the apparatus contacts the circuit board, when the apparatus is in use in testing the UUT, only at the respective vias and within regions of the circuit board that are devoid of active electronic components of the UUT.

7. Apparatus for use in testing a unit under test (UUT), the UUT including a ball grid array (BGA) device physically connected to a first surface of a first circuit board, the circuit board also including at least one via on a second surface of the circuit board, the first and second surfaces facing mutually opposite directions, the via being electrically connected to at least one electrically active point of the BGA device, the apparatus comprising:

a first assembly including a plurality of members extending from a surface of the assembly, the assembly also including at least one electrically conductive test probe extending from the surface of the assembly; and a second assembly that includes openings dimensioned to receive respective ones of the members, the second assembly including a first mechanism that permits, when the members are in the openings, the members to be engaged by the first mechanism, the second assembly also including a second mechanism that permits, when the members are engaged by the first mechanism, a force to be applied to the members that causes one of the first and second assemblies to be urged toward the other of the first and second assemblies;

wherein, when the apparatus is in use in testing the UUT, the members extend through respective openings in the circuit board, and the force permits the at least one test probe to be brought into physical contact with the via of the circuit board, and wherein the members each comprise two respective portions, one of the respective portions being undersized relative to the respective openings, the other of the respective portions being oversized relative to the respective openings, and when the apparatus is in use in testing the UUT, the other of the respective portions extends from the surface of the first assembly to the second surface of the circuit board, and provides a gap between the second surface of the circuit board and the surface of the first assembly that prevents the apparatus from damaging the UUT and allows the at least one test probe to contact the at least one via.

8. Apparatus according to claim 7, wherein the at least one test probe is spring-loaded.

9. Apparatus according to claim 7, wherein the first assembly comprises a second circuit board, the surface of the first assembly being a surface of the second circuit board.

10. Apparatus according to claim 9, wherein the second circuit board comprises an electromechanical connection mechanism that may be used to electrically couple the at least one test probe to an electronic analysis system.

11. Apparatus according to claim 7, wherein the respective openings are in a region of the circuit board extending around a periphery of the BGA device, said region being devoid of active electronic components of the UUT.

12. Apparatus according to claim 7, wherein the at least one via comprises a plurality of vias, the at least one probe comprises a plurality of probes, the plurality of probes contact respective vias, and the apparatus contacts the circuit board, when the apparatus is in use in testing the UUT, only at the respective vias and within regions of the circuit board that are devoid of active electronic components of the UUT.

* * * * *